United States Patent [19]

Alsup et al.

[11] 4,100,498
[45] Jul. 11, 1978

[54] DISCRETE CHIRP FREQUENCY SYNTHESIZER

[75] Inventors: James M. Alsup; Harper J. Whitehouse, both of San Diego, Calif.

[73] Assignee: The United States of America as represented by the Secretary of the Navy, Washington, D.C.

[21] Appl. No.: 807,863

[22] Filed: Jun. 20, 1977

[51] Int. Cl.² ............... H03B 19/14; H03B 21/02
[52] U.S. Cl. ............................ 328/14; 328/18; 328/21; 307/299 R; 331/107 A; 333/30 R
[58] Field of Search ............... 328/14, 18, 21; 333/70 T, 30 R; 331/107 A; 307/299 R

[56] References Cited

U.S. PATENT DOCUMENTS

| 3,824,586 | 7/1974 | Quate | 328/14 X |
| 4,070,638 | 1/1978 | Reerer | 333/30 R |

*Primary Examiner*—John S. Heyman
*Attorney, Agent, or Firm*—Richard S. Sciascia; Ervin F. Johnston; John Stan

[57] ABSTRACT

An automatic frequency-hop controller for a surface acoustic wave (SAW) synthesizer is used with a means for generating two chirp signals, one having a delay with respect to the other. It comprises a SAW device, adapted to receive the chirp signals. The SAW device comprises a substrate and a pair of sets of interdigitated electrodes, disposed on the surface of the substrate, one set at each end, the electrodes receiving the electrical chirp signals or corresponding impulse signals. Another set of interdigitated electrodes, which are output electrodes, are also disposed on the surface of the substrate, the electrodes of all sets being parallel. The output set of electrodes are so disposed as to receive the acoustic waves generated by the pair of sets of electrodes, and transduce them back to electrical signals. For the case when quadrature summation is performed by offset acoustic delays on the substrate, the pair of sets of electrodes and the output set of electrodes are so disposed with respect to each other that the signal received from the top parts of the output set of electrodes has a phase shift of 90°, at a frequency $f_c$, with respect to the phase shift of the signal received from the bottom parts of the output electrodes.

The controller further comprises means connected to the output set of electrodes, which selectively controls/mixes the transmission of the electrical signals received from the output set of electrodes. The controlling/mixing means has the capability of transmitting signals from the output set in any sequence, the frequency of the output signal being determined by the particular signal path which is activated.

Another embodiment of the invention includes the means for generating the two chirp signals.

12 Claims, 5 Drawing Figures

AUTOMATIC FREQUENCY—HOP CONTROLLER FOR A SAW SYNTHESIZER, WITH OFFSET LAUNCH INTERDIGITATIONS.

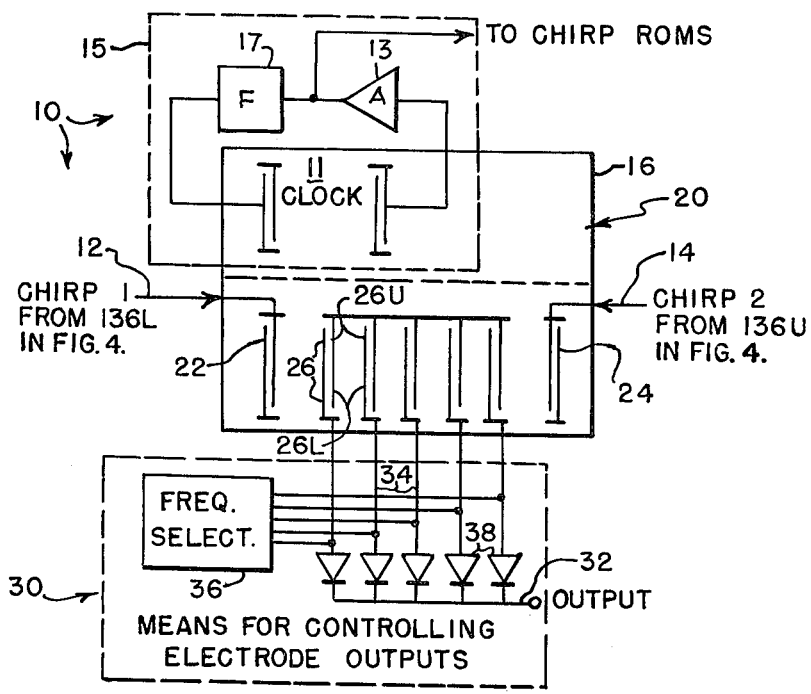
FIG. 1. AUTOMATIC FREQUENCY—HOP CONTROLLER FOR A SAW SYNTHESIZER, WITH OFFSET LAUNCH INTERDIGITATIONS.
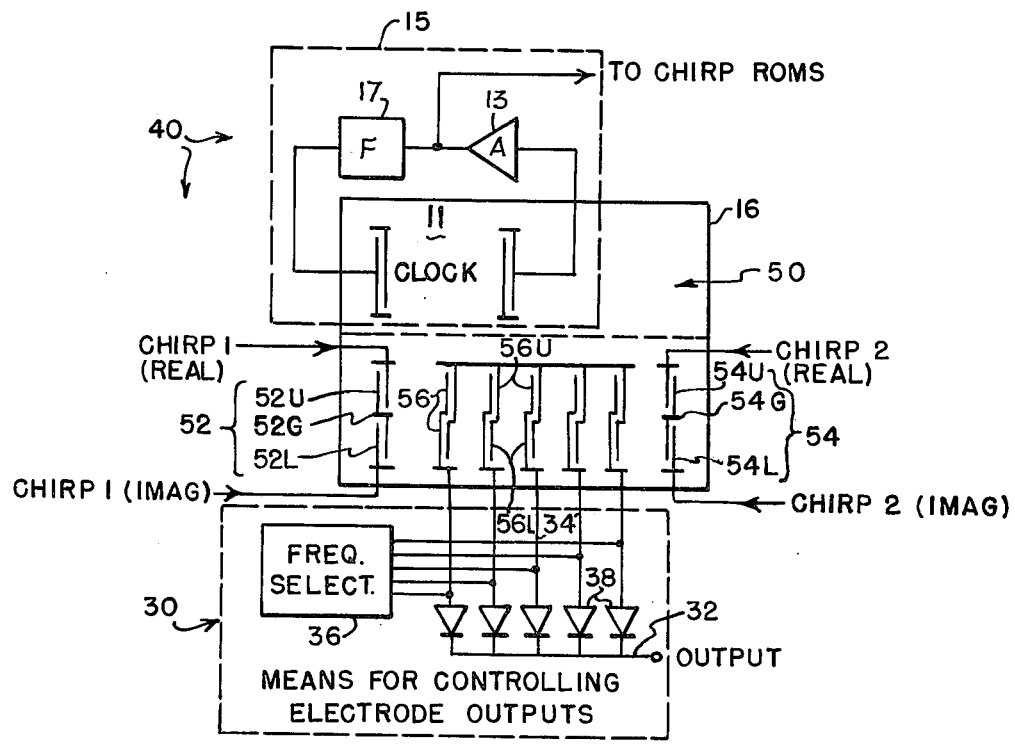
FIG. 2. AUTOMATIC FREQUENCY-HOP CONTROLLER FOR A SAW SYNTHESIZER, WITH OFFSET RECEIVE INTERDIGITATIONS.

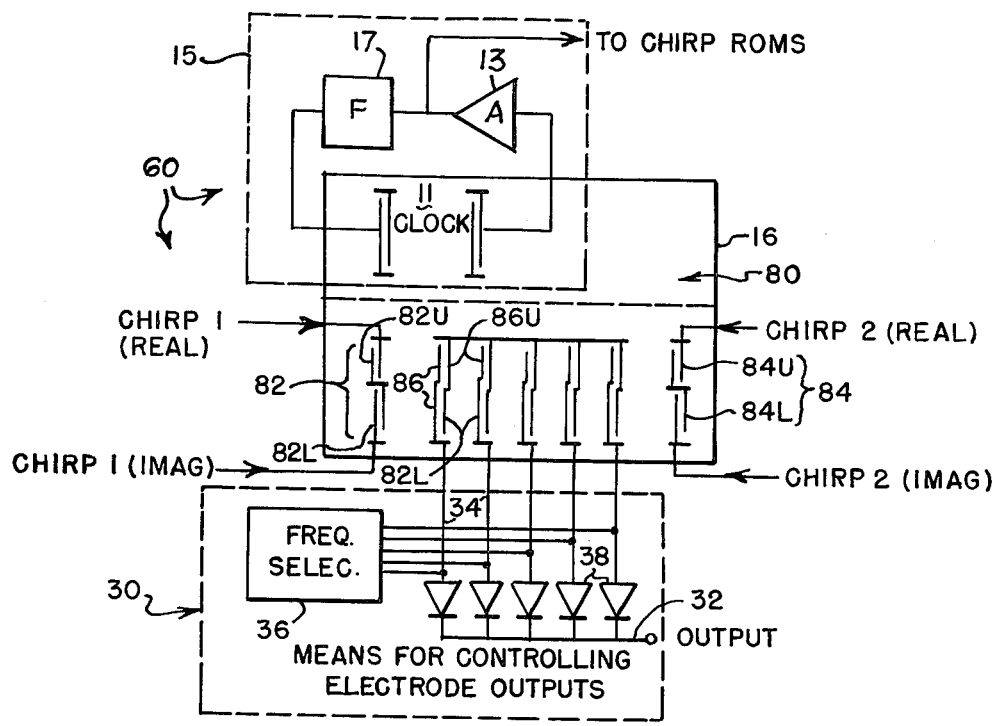
FIG. 3. AUTOMATIC FREQUENCY-HOP CONTROLLER FOR A SAW SYNTHESIZER WITH BOTH INTERDIGITATIONS OFFSET.
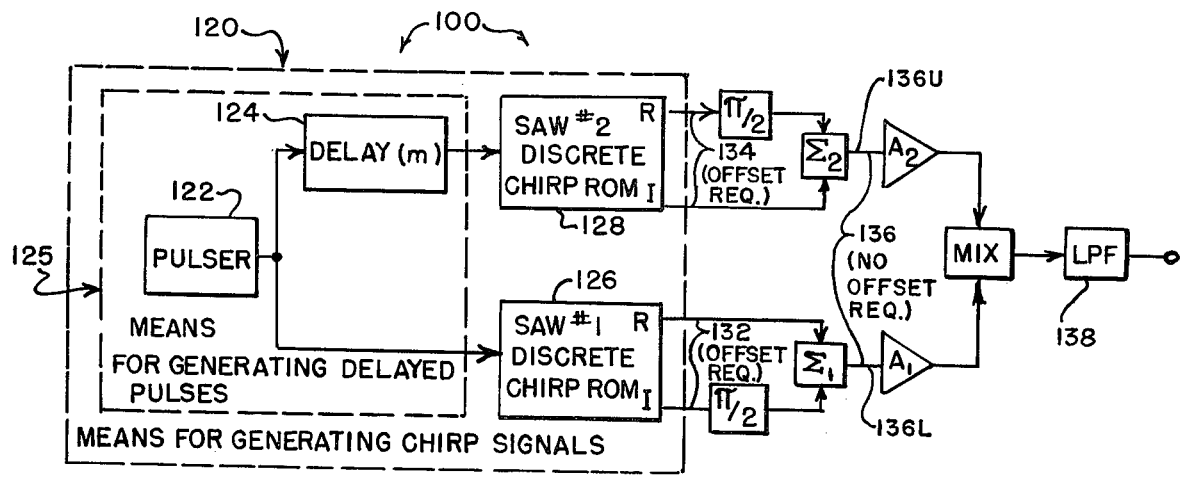
FIG. 4. FREQUENCY SYNTHESIZER USING SAW DISCRETE CHIRP ROMS.

FIG. 5A. AT BASEBAND.  FIG. 5B. AT THE FUNDAMENTAL FREQUENCY, $f_o$.  FIG. 5C. AT THE SECOND HARMONIC, $2f_o$.

BASE BAND AND HARMONIC OUTPUT WAVEFORMS OF CIRCUIT OF FIG. 4.

DISCRETE CHIRP FREQUENCY SYNTHESIZER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to surface acoustic wave sampled data filters which can be utilized as serial access read-only-memories to directly implement at carrier frequencies a coherent fast-frequency-hop synthesizer in the VHF and UHF ranges. The frequency synthesis scheme uses a surface acoustic wave (SAW) discrete chirp filter.

To show, briefly, the evolution of frequency synthesizers, originally, a knob, of an audio oscillator, for example, was turned and the value of an index marker at the knob was read. Later on, programmable frequency synthesizers were developed, which do not require manually turning a knob, wherein servo motors cause rotation of the equivalent of a knob to automatically choose a sequence of frequencies. An electrical signal of the proper code is supplied.

A frequency hopper is an extension of a frequency synthesizer, except the term frequency "hopping" implies that the frequency selection is done rapidly, compared to the speed of frequency selection in the programmable frequency synthesizer. Frequency hopping is often done in the context of spread spectrum communications systems.

Many types of frequency synthesizers have been developed over the years, but only recently have read-only-memory (ROM) synthesizers begun to reach maturity. This has occurred primarily because of the advent of sine-cosine lookup tables implemented in digital hardware. Comprehensive background material regarding non-ROM-based frequency synthesizers is furnished by Kroupa, Venceslav F., *Frequency Synthesis*, Halsted Press/John Wiley, New York, 1973. ROM-based synthesis is discussed in references hereinbelow.

However, other types of ROM devices are becoming available, and, in particular, surface acoustic wave (SAW) devices are starting to serve this purpose. ROM synthesis is particularly suited for applications which require coherent fast frequency hopping. SAW ROM technology makes possible the direct extension of ROM synthesis into the VHF and UHF ranges.

There are several prior art methods used to synthesize a sampled sinusoid using discrete ROMs. One method utilizes one period of a sampled sinusoid stored in sequential order in a random access ROM. These methods are described in Tierney, Joseph, Charles M. Rader, and Bernard Gold, "A Digital Frequency Synthesizer," *IEEE Trans. Audio and Electroacoustics*, Vol. AU-19, March 1971, pp. 48–57, and Hosking, Rodger H., "Direct Digital Frequency Synthesis," 1973 *IEEE Intercon Technical Papers*, Section 34/1, New York, 1973.

If all samples of the ROM are read in sequence with a sample time interval $\Delta t$, then a sinusoid of period T and frequency $f_o$ is generated, where $T = N \Delta t = 1/f_o$. However, if every kth sample is read with the same sample interval $\Delta t$, then the frequency of the generated sinusoid is $kf_o$. Since $k$ can take on the values $0, 1, \ldots, N-1$, a total of N frequencies which are all harmonically related can be generated. The sampling ambiguity called aliasing may be evident depending upon whether complex or real sinusoids are generated.

A second method for the generation of sampled sinusoids has special application in SAW technology because it utilizes serial-access ROMs. This method consists in multiplying the outputs of two N-sample discrete chirp ROMs whose serial readouts are mutually processed by $m$ samples to synthesize the frequency $mf_o$. For complex ROMs of the form $\exp(j\pi n^2/N)$, the product takes the form $$\exp(j\pi n^2/N) \exp(-j\pi(n-m)^2/N) = \exp(j2\pi mn/N) \exp(-j\pi m^2/N), \quad (1)$$

where $n$ corresponds to the time index and $m$ corresponds to the frequency index. The right hand side of this equation can be interpreted as a sampled complex sinusoid of frequency index $m$ multiplied by a complex phase shift which is dependent only on $m$. It will also be noted that $\exp(j\pi n^2/N)$ is a periodic function with period $N \Delta t$ (N even) or $2 N \Delta t$ (N odd). This second prior art method has an equivalent continuous time (non-sampled) implementation utilizing a corresponding continuous SAW ROM.

For frequency hopping applications, either of these two methods requires a hopping interval equal to or greater than $T = N \Delta t$ so that at least one period of each frequency is synthesized with a common nominal bandwidth less than or equal to $1/T$. Thus, the maximum hopping rate for these types of synthesizers is equal to $f_o$. Synthesis may take place at a carrier frequency $f_c$, in which case $f_o$ refers to the "fundamental" frequency which would be observed if the comb-like band of harmonics to be generated at the carrier $f_c$ were shifted to baseband.

Synthesis via read-only-memory is attractive because it makes possible the coherent generation of a harmonic group of discrete frequencies. These frequencies all will start with known initial phases, and use of this a priori information can be made to build coherent receivers capable of recognizing particular phase relationships among sequentially-produced tone bursts within the operating band of the synthesizer.

ROM synthesis is also attractive because nearly instantaneous changes can be made when hopping from one frequency to the next. In contrast, a phase-lock-loop synthesizer invariably requires several periods of the waveform being synthesized before a stable lock is acquired.

Discrete chirp transversal filters have been used in the prior art as elements in chirp-Z transform (CZT) processor systems. Such use has been, for example, described by Alsup, J. M., R. W. Means, and H. J. Whitehouse, "Real Time Discrete Fourier Transforms Using Surface Acoustic Wave Devices," *Proc. IEE International Specialist Seminar on Component Performance and Systems Application of Surface Acoustic Wave Devices*, Aviemore, Scotland, Sept. 24–28, 1973; and by Alsup, J. M., "Surface Acoustic Wave CZT Processors," *Proceedings 1974 Ulltrasonics Symposium*, Milwaukee, Wis., Nov. 1974, pp. 378–381.

Such filters may be regarded as acoustic ROMs and used to implement coherent frequency synthesis. Periodic impulsing of such a SAW discrete chirp filter will result in periodic generation of the function $\exp(j\pi n^2/N)$ on a carrier, so that two such ROMs operating at carrier frequencies $f_1$ and $f_2$ can provide the necessary signals to generate a tone burst over the duration of the ROM outputs. This tone is obtained by delaying one signal with respect to the other and multiplying the two ROM outputs:

$$p(t-n\,\Delta t)\cos[2\pi f_1 t + \pi n^2/N]\,p(t-n\,\Delta t)\cos[2\pi f_2 t - \pi(n-m)^2/N] = p^2(t-n\,\Delta t)\cos[2\pi(f_1+f_2)t + 2\pi mn/N - \pi m^2/N] + (f_1-f_2)\text{-term}, \quad (2)$$

where $p(t)$ is the sampling window, e.g., $$p(t) = 1, 0 < t < \Delta t, \text{ and } p(t) = 0 \text{ otherwise}. \quad (3)$$

The second SAW chirp ROM output is identical to that of the first one except that it is delayed by an amount $m\,\Delta t$, and its modulation is the complex conjugate of that of the first ROM, which is equivalent to a negative frequency slope. Since $m$ can vary over the interval $0, 1, \ldots, N-1$ in an arbitrary order, control over the hopping sequence is flexible.

Discrete chirp ROMs are also useful since they can be used to generate a given sinusoid within the band of operation for an arbitrary length of time. This property is important for applications where frequency hopping is required on a part-time basis only. Continuous SAW chirp filters can also be used as ROMs in a similar sum or difference frequency scheme, but care must be taken to account for possible discontinuities where end-points of the chirp function are encountered. Such use is described by Atzeni, C., G. Manes, and L. Masotti, "Signal Processing by Analog Chirp-Transformation Using SAW Devices," *IEEE* 1975 *Ultrasonics Symposium Proceedings*, Los Angeles, CA, Sept. 1975, Paper G-6.

SUMMARY OF THE INVENTION

An automatic frequency-hop controller for a surface acoustic wave (SAW) synthesizer is used with a means for generating two chirp signals, one having a delay with respect to the other. It comprises a SAW device, adapted to receive the chirp signals. The SAW device comprises a substrate and a pair of sets of interdigitated electrodes, disposed on the surface of the substrate, one set at each end, the electrodes receiving the electrical chirp signals. Another set of interdigitated electrodes, which are output electrodes, are also disposed on the surface of the substrate, the electrodes of all sets being parallel. As is discussed hereinbelow, a set may comprise groups of electrodes, each group may, in turn, comprise subgroups. The output set of electrodes are so disposed as to receive the acoustic waves generated by the pair of sets of electrodes and transduce them back to electrical signals.

The pair of sets of electrodes and the output set of electrodes are so disposed with respect to each other that the signal received from the top parts of the output set of electrodes has a phase shift of 90°, at a frequency $f_c$, with respect to the phase shift of the signal received from the bottom parts of the output electrodes. (When on-substrate quadrature summation is required. Not so required in FIG. 1).

The controller further comprises means connected to the output set of electrodes, which selectively controls/mixes the transmission of the electrical signals from the output set of electrodes, the controlling/mixing means having the capability of forming the sum or difference frequency of the two input signals and of transmitting such components from the output set in any sequence, the frequency of the output signal being determined by the particular signal path (diode) which is activated.

STATEMENT OF THE OBJECTS OF THE INVENTION

An object of the invention is to provide a frequency synthesizer useful for frequency hopping at rates greater than that provided by conventional digital techniques.

Another object of the invention is to provide a frequency synthesizer useful in both the VHF and UHF ranges.

Yet another object of the invention is to provide a frequency synthesizer of relatively simple construction using SAW devices.

These and other objects of the invention will become more readily apparent from the ensuing specification when taken together with the drawings.

BRIEF DESCRIPTION OF THE DRAWINGS

FIG. 1 is a block diagram of an automatic frequency-hop controller for a SAW synthesizer.

FIG. 2 is a block diagram of an automatic frequency-hop controller for a SAW synthesizer with offset receive interdigitations.

FIG. 3 is a block diagram of an automatic frequency-hop controller for a SAW synthesizer with both launch and receive interdigitations offset.

FIG. 4 is a block diagram of a frequency synthesizer using SAW discrete chirp ROMs.

DESCRIPTION OF THE PREFERRED EMBODIMENTS

Figure 5:
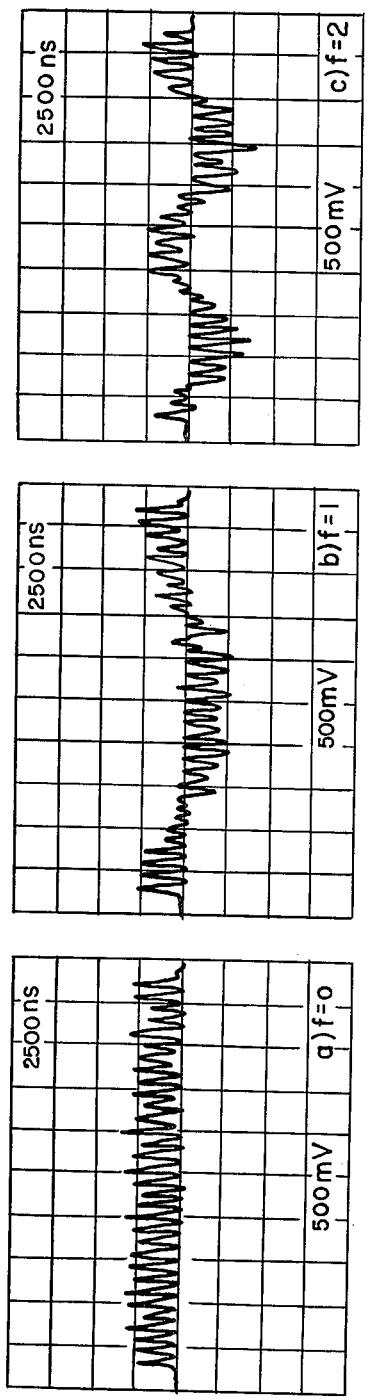
FIG. 5 is a set of graphs showing "fundamental" and harmonic output waveforms of the circuit of FIG. 4.

Referring now to FIG. 1, therein is shown an automatic frequency-hop controller 10 for a surface acoustic wave (SAW) synthesizer, for use with a means for generating two chirp signals received at inputs 12 and 14, one chirp signal having a delay with respect to the other. Generally the two chirp signals would be at different carrier frequencies.

Chirp signal generation by means of surface acoustic wave (SAW) devices is old in the art. A very basic description is given by Court, I.N., "Microwave Acoustic Devices for Pulse Compression Filter," in *IEEE Trans. on Microwave Theory and Techniques* Vol. MTT 17, No. 11 Nov. 1969; pp. 968–986. A very simple implementation is shown in FIG. 9 on Page 975, of this reference. In a conventional chirp-coded SAW device the spacing between adjacent interdigitations, or groups of interdigitations, varies in a prescribed manner. A discrete chirp-coded SAW device, on the other hand, differs from the conventional, in that, among other differences, the top half of the device is coded so as to generate the real, or imaginary, part of the chirp signal, while the bottom halves of the electrodes are configured so that, when impulsed, they generate the imaginary, or real part, of the chirp signal. When real and imaginary parts of a chirp signal are specified, a discrete chirp signal is generally implied. This invention is primarily designed for use with a discrete chirp signal, but the teachings herein may be used for the continuous chirp signal.

The controller 10 comprises a surface acoustic wave device 20, adapted to receive the chirp signals, which comprises a substrate 16, on which are disposed a pair of sets of interdigitated electrodes, 22 and 24, one set at each end. The electrodes 22 and 24 receive the electrical chirp signals, at inputs 12 90°-sum and 14, 90°-sum and transduce them to acoustic waves, which traverse the surface of the substrate 16. If the real and imaginary parts of CHIRP1 or CHIRP2 have been combined in quadrature externally, then the offset is not required. This is described with more specificity hereinbelow.

Another set of interdigitated electrodes 26, which are output electrodes, are also disposed on the surface of the substrate 16, all electrodes, 22, 24 and 26, being parallel. The output set of electrodes 26 are so disposed as to receive the acoustic waves generated by the pair of sets of electrodes, 22 and 24, and transduce them back to electrical signals.

The controller 10 further comprises means 30 connected to the output set of electrodes, which selectively controls the transmission of the electrical signals received from the output set of electrodes 26, the controlling means having the capability of transmitting signals from the output set 26 in any sequence, the frequency of the output signal, at output 32, being determined by the particular diode switch (38, described hereinbelow) being activated.

In the controller 10 shown in FIG. 1, each of the pair of sets of electrodes, 22 and 24, which are input electrodes, may comprise a group of many electrodes. Each group, in turn, may comprise two or more subgroups. This corresponds to the case when chirp generation takes place on the same substrate as the "controller." To simplify the drawings, each group is shown to consist of a pair of electrodes, 22 and 24, both pairs being parallel to each other.

All other SAW devices shown in the drawings may also consist of groups and subgroups of electrodes.

In the controller 10, as is shown in FIG. 1, the input sets of electrodes 22 may each consist of only one pair of electrodes, if chirp generation/quadrature takes place off substrate.

In another embodiment of the invention, as is shown in FIG. 2, in the controller 40 the launch pairs of electrodes, 52 and 54, are not offset, but are separated into upper and lower halves and the output electrodes 56 are configured so that the upper half 56U of each output electrode is offset by one-quarter wavelength from its corresponding lower half 56L. The horizontal electrodes 52G and 54G are grounded.

In yet another embodiment, shown in FIG. 3, in the controller 70, the upper halves, 82U and 84U, of the input electrodes, 82 and 84, are configured so as to be offset from the lower halves 82L and 84L, of the input electrodes. The output electrodes 86 are configured so that the upper half 86U of each output electrode is offset from its corresponding lower half 86L, the total amount of offset for the top and bottom halves of the input and output electrodes being one-quarter wavelength.

It will be noted that, in the embodiment 10 of FIG. 1, when the electrodes 22 and 26 are not offset, then both the real and imaginary components of the chirp signals must be first combined before arriving at inputs 12 and 14. This combination takes place in the $\Sigma_1$ and $\Sigma_2$ summers, shown in FIG. 4, the complex chirp signal appearing at outputs 136L and 136U.

On the other hand, as is shown in the embodiments 40 of FIG. 2 and 60 of FIG. 3, if there is a delay equivalent to a 90° phase difference between the signal received at the top parts of the receive electrodes, 56U in FIG. 2 and 86U in FIG. 3, and the bottom parts 56L and 86L, then it is not necessary that the real and imaginary parts of chirp signals #1 and #2 be first summed. Rather, the summing takes place on substrates 50 and 80.

The controller 10, 40 or 60, of FIGS. 1, 2 or 3, may further comprise the means 120, shown in FIG. 4, for generating the two chirp signals, the combination comprising a frequency synthesizer. Generally, the means for generating chirp signals would comprise two sets of interdigitated electrodes, disposed on the same substrate 16, and spaced in such a manner that, when pulsed by an electrical signal, a chirp acoustic signal propagates across the substrate. As is known in the prior art, in a discrete chirp electrode configuration, the sum of the squares of the electrode lengths representing the real and imaginary parts of a sample value of the chirp adds to a constant for all samples.

The synthesizer may further comprise means 15, shown in FIGS. 1, 2 and 3, disposed upon the substrate 16 for generating a timing signal, to control the timing of the chirp signals. Generally, the clocking structure 17 must be on the same substrate 16 as the input and output electrodes, such as 22, 24, and 26. A positive feedback amplifier 13 is required. Filter 17 stabilizes the clocking frequency. Such structures have been described by Lee, L. L., B. J. Hunsinger, and F. Y. Cho, "A SAW-Stabilized Pulse Generator," *IEEE Trans. Sonics and Ultrasonics*, Vol. SU-22, March 1975, pp. 141–142; and by Gilden M., T. M. Reeder, and A. J. DeMaria, "The Mode Locked SAW Oscillator," *IEEE 1975 Ultrasonics Symposium Proceedings*, Los Angeles, CA, Sept. 1975, Paper P-3.

In the controller 10, 40 or 60, shown in FIGS. 1–3, the signal controlling means 30 may comprise means 34 adapted to receive the signals from the output set of electrodes, 26, 56, or 86, which has the same number of inputs as there are pairs of electrodes in the output set of electrodes, the inputs being connected to the electrode outputs. Means 36 are connected to the output electrodes, 26, 56, or 86 for selectively controlling/mixing the sequence in which the output leads 34 conduct signals. The controller 10, 40 or 70 may further comprise means 38 connected to the output electrodes, 26, 56, or 86, and to the selective means 36 which comprise a set of unilateral conducting devices 38, one in the output path of each of the pairs of output electrodes. Devices 38 can be enabled to pass signals through their respective output paths, to the output 32, and simultaneously generate the sum or difference frequency of the two input signals.

The controlling/mixing means 30 may include SAW programmable diode multipliers 38 such as have been described by Reeder, T. M., "Electronically Variable Chirp Signal Correlation with the Diode Correlator," *IEEE International Microwave Symposium Digest*, Atlanta, GA., June 1974, pp. 237–239. The diode multipliers also achieve a carrier multiplication of the two chirp signals. Not only do the programmable diodes 38 select the output frequency, but they multiply the two chirp signals, thereby creating a product frequency, which has a sum and difference frequency associated with it, which appear at the output 32. A low-pass filter, such as filter 138, shown in FIG. 4, would select the difference frequency while a bandpass filter would select the sum frequency.

Referring now to FIG. 4, in the synthesizer the means 120 for generating the two chirp signals may comprise a means, comprising pulser 122 and delay line 124, for generating two sequences of pulses, one sequence delayed with respect to the other. A first acoustic surface wave (SAW) device 126, whose input is connected to the output of the pulser, has electrodes so configured that, when pulsed, a discrete chirp signal is obtained at its output. A second SAW device 128, substantially similar to the first SAW device, except that it is not necessarily configured to generate a chirp signal of the same carrier frequency as SAW device 126, has its input connected to the output of delay line 124.

The frequency synthesizer 100 shown in FIG. 4 illustrates an experimental setup used to perform frequency synthesis using SAW discrete chirp ROMs, 126 and 128, where $f_1 = f_2$ (carriers). The baseband output waveform is shown in FIG. 5, and could be filtered additionally to make the carrier waveform low-pass.

In summary, using surface acoustic wave devices as principal elements in ROM frequency synthesis has been demonstrated by this invention. In particular, the discrete chirp SAW device is well suited because of its ability to function at a specific carrier frequency of interest, its inherent phase predictability, its fast-hop capability, and its cyclic nature in the generation of long-duration single frequency waveforms. Such SAW devices also have the characteristic properties of relatively lightweight, low power, and small size, and may be used as direct synthesizers in the VHF and UHF frequency regions and for those applications where the hopping rate required may exceed the capabilities of conventional digital techniques.

Obviously, many modifications and variations of the present invention are possible in the light of the above teachings, and, it is therefore understood that within the scope of the disclosed inventive concept, the invention may be practiced otherwise than specifically described.

What is claimed is:

1. An automatic frequency-hop controller for a surface acoustic wave (SAW) synthesizer, comprising:
   a surface acoustic wave device, adapted to receive the chirp signals, comprising:
      a substrate;
      a pair of sets of interdigitated electrodes, disposed on the surface of the substrate, one set at each end, the electrodes receiving the electrical chirp signals and transducing them to acoustic waves, which traverse the surface of the substrate; and
      another set of interdigitated electrodes, which are output electrodes, also disposed on the surface of the substrate, the electrodes of all sets being parallel, the output set of electrodes being so disposed as to receive the acoustic waves generated by the pair of sets of electrodes, and transduce them back to electrical signals;
   means for generating two chirp signals, on a substrate, one chirp signal having a delay with respect to the other, the means of generating either chirp signal comprising a plurality of groups of electrodes, the upper half of each electrode being so disposed with respect to its lower half that the signal received from the top parts of the electrodes has a phase shift of 90°, at a carrier frequency $f_c$, with respect to the phase shift of the signal received from the corresponding bottom parts of the electrodes; the synthesizer further comprising:
   means, including switches which can be enabled, that is, activated, connected to the output set of electrodes, which selectively controls/mixes the transmission of the electrical signals received from the output set of electrodes, the selective controlling/mixing means having the capability of transmitting signals from the output set in any sequence, the frequency of the output signal being determined by the particular output switch which is activated at any given time.

2. An automatic frequency-hop controller for a surface acoustic wave (SAW) synthesizer, for use with a means for generating two chirp signals, one chirp signal having a delay with respect to the other, comprising:
   a surface acoustic wave device, adapted to receive the chirp signals, comprising:
      a substrate;
      a pair of sets of interdigitated electrodes, disposed on the surface of the substrate, one set at each end, the electrodes receiving the electrical chirp signals and transducing them to acoustic waves, which traverse the surface of the substrate; and
      another set of interdigitated electrodes, which are output electrodes, also disposed on the surface of the substrate, the electrodes of all sets being parallel, the output set of electrodes being so disposed as to receive the acoustic waves generated by the pair of sets of electrodes, and transduce them back to electrical signals;
   the pair of sets of electrodes and the output set of electrodes being so disposed with respect to each other that the signal received from the top parts of the output set of electrodes has a phase shift of 90°, at a carrier frequency $f_c$, with respect to the phase shift of the signal received from the bottom parts of the output electrodes; the controller/mixer further comprising:
   means, including switches which can be enabled, that is, activated, connected to the output set of electrodes, which selectively controls/mixes the transmission of the electrical signals received from the output set of electrodes, the selective controlling/mixing means having the capability of transmitting signals from the output set in any sequence, the frequency of the output signal being determined by the particular output switch which is activated at any given time.

3. The controller according to claim 2 wherein:
   the pair of sets of electrodes, which are input electrodes, comprise two sets of electrodes, an upper and lower set, each set consisting of pairs of electrodes, a pair of one set being parallel to a corresponding pair of the other set, the sum of the lengths squared of each two corresponding pairs of electrodes being a constant.

4. The controller according to claim 3 wherein:
   the input sets of electrodes each consist of several groups of electrodes; and wherein
   the upper groups of input electrodes are so configured as to be offset by one-quarter wavelength from the lower groups of input electrodes.

5. The controller according to claim 3 wherein:
   the output electrodes are configured so that the upper half of each output electrode is offset by one-quarter wavelength from its corresponding lower half.

6. The controller according to claim 3, wherein
   the upper halves of the input electrodes are configured so as to be offset from the bottom halves of the input electrodes; and wherein:
   the output electrodes are configured so that the upper half of each output electrode is offset from its corresponding bottom half;

the total amount of offset for the top and bottom halves of the input and output electrodes being one-quarter wavelength.

7. The controller according to claim 3 further comprising:
the means for generating the two chirp signals, the combination comprising a frequency synthesizer.

8. The synthesizer according to claim 7 further comprising:
means disposed upon the substrate for generating a timing signal, to control the timing of the chirp signals.

9. The synthesizer according to claim 8 wherein the signal controlling/mixing means comprises:
means, adapted to receive the signals from the output set of electrodes, which has the same number of inputs as there are pairs of electrodes in the output set of electrodes, the inputs being connected to the electrode outputs; and
means, connected to the output electrodes; for selectively controlling/mixing the sequence in which the output leads conduct signals, that is, the hop sequence.

10. The synthesizer according to claim 9, wherein the controlling means further comprises:
means, connected to the output electrodes and to the selective controlling means, comprising a set of unilateral conducting devices, one in the output path of each of the pairs of output electrodes, which devices can be enabled to pass signals through the respective output paths and simultaneously generate the sum or difference frequency of the two input signals.

11. The synthesizer according to claim 7, wherein:
the means for generating two chirp signals comprises:
a means for generating two sequences of pulses, one sequence delayed with respect to the other;
a first acoustic surface wave (SAW) device, whose input is connected to the output of one of the pulse generating means, which has electrodes so configured that, when pulsed, a discrete chirp signal is obtained at its output; and
a second SAW device, substantially similar to the first SAW device, whose input is connected to the output of the other pulse generating means.

12. The synthesizer according to claim 11 wherein:
the first and second SAW devices are disposed on the same substrate in place of the pair of input sets along with the other set of output interdigitated electrodes.

* * * * *